US010062705B1

(12) United States Patent
Xu et al.

(10) Patent No.: US 10,062,705 B1
(45) Date of Patent: Aug. 28, 2018

(54) METHOD OF MANUFACTURING A FLASH MEMORY

(71) Applicant: UNITED MICROELECTRONICS CORP., Hsin-Chu (TW)

(72) Inventors: Wei Xu, Singapore (SG); JiZhou Han, Singapore (SG); Wang Xiang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/487,404

(22) Filed: Apr. 13, 2017

(51) Int. Cl.
  *H01L 27/11568* (2017.01)
  *H01L 27/11573* (2017.01)
  *H01L 21/02* (2006.01)
  *H01L 29/51* (2006.01)
  *H01L 29/792* (2006.01)
  *H01L 29/66* (2006.01)

(52) U.S. Cl.
  CPC .... *H01L 27/11568* (2013.01); *H01L 21/0217* (2013.01); *H01L 21/02164* (2013.01); *H01L 27/11573* (2013.01); *H01L 29/518* (2013.01); *H01L 29/66553* (2013.01); *H01L 29/66833* (2013.01); *H01L 29/792* (2013.01)

(58) Field of Classification Search
  CPC ......... H01L 29/42344; H01L 21/28282; H01L 29/66833; H01L 29/792; H01L 2924/00014; H01L 27/1157
  See application file for complete search history.

(56) References Cited

U.S. PATENT DOCUMENTS

| | | | |
|---|---|---|---|
| 2012/0068243 A1* | 3/2012 | Kawashima | H01L 29/792 257/315 |
| 2016/0049525 A1 | 2/2016 | Liu | |
| 2016/0111510 A1* | 4/2016 | Tseng | H01L 29/792 257/326 |
| 2017/0278856 A1* | 9/2017 | Yamaguchi | H01L 27/11563 |

* cited by examiner

*Primary Examiner* — Tony Tran
(74) *Attorney, Agent, or Firm* — Winston Hsu

(57) ABSTRACT

A method of manufacturing a flash memory includes providing a substrate, a memory gate on the substrate, a hard mask on the memory gate, a spacer on a sidewall of the memory gate, and a select gate disposed on a sidewall of the spacer. A first silicon oxide layer is formed to conformally cover the memory gate, the hard mask, the spacer, and the select gate. A thickness of the first silicon oxide layer is smaller than 0.54 of a thickness of the hard mask. Later, the first silicon oxide layer is thinned by a dry etching process. After that, the first silicon oxide layer and the hard mask are entirely removed by a wet etching process.

6 Claims, 4 Drawing Sheets

US 10,062,705 B1

METHOD OF MANUFACTURING A FLASH MEMORY

BACKGROUND OF THE INVENTION

1. Field of the Invention

The present invention generally relates to a method of manufacturing a flash memory, and more particularly, to a method for preventing etch damage on an oxide-nitride spacer.

2. Description of the Prior Art

Flash memory is classified as non-volatile memory because a memory cell in the flash memory can retain the data stored in the memory cell without periodic refreshing. Most prior art flash memory can store a single bit in a memory cell. In other words, the memory cell can either store a "one" or a "zero".

A split-gate memory cell is a type of non-volatile memory cell in which a select gate is placed adjacent to a memory gate. During programming of a split-gate memory cell, the select gate is biased at a relatively low voltage, while only the memory gate is biased at a high voltage to provide a vertical electric field necessary for hot-carrier injection. Since acceleration of carriers takes place in the channel region mostly under the select gate, the relatively low voltage on the select gate results in more efficient carrier acceleration in the horizontal direction compared to a conventional flash memory cell. This makes hot-carrier injection more efficient with lower current and lower power consumption during programming operations. A split-gate memory cell may be programmed using techniques other than hot-carrier injection. Depending on the technique, advantages over the conventional flash memory cell during programming operations may vary.

In the manufacture of the split-gate memory cell, the oxide-nitride (ON) spacer isolation between the memory gate and select gate may be easily damaged by common etching processes. This damage issue may influence the breakdown voltage between the memory gate and select gate. Accordingly, there is a need for a memory device and methods for preventing the ON spacer damage in order to maintain the performance and reliability of the memory device.

SUMMARY OF THE INVENTION

Accordingly, one objective of the present invention is to provide a method of fabricating a flash memory free from etch damage without requiring significant design change or excessive process cost.

One objective of the present invention is to provide a method of manufacturing a flash memory comprising providing a substrate, a memory gate on the substrate, a hard mask on the memory gate, a spacer on a sidewall of the memory gate, and a select gate disposed on a sidewall of the spacer. Later, a first silicon oxide layer is formed to conformally cover the memory gate, the hard mask, the spacer, and the select gate. A thickness of the first silicon oxide layer is smaller than 0.54 of a thickness of the hard mask. The first silicon oxide layer is then thinned by a dry etching process. After that, the first silicon oxide layer and the hard mask are entirely removed by a wet etching process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are cross-sectional views depicting an exemplary process flow of manufacturing a flash memory in accordance with the embodiment of the present invention, wherein:

FIG. 1 depicts a step of fabricating a memory gate;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6; and
FIG. 8 is a fabricating stage following FIG. 7.

DETAILED DESCRIPTION

Figure 1:
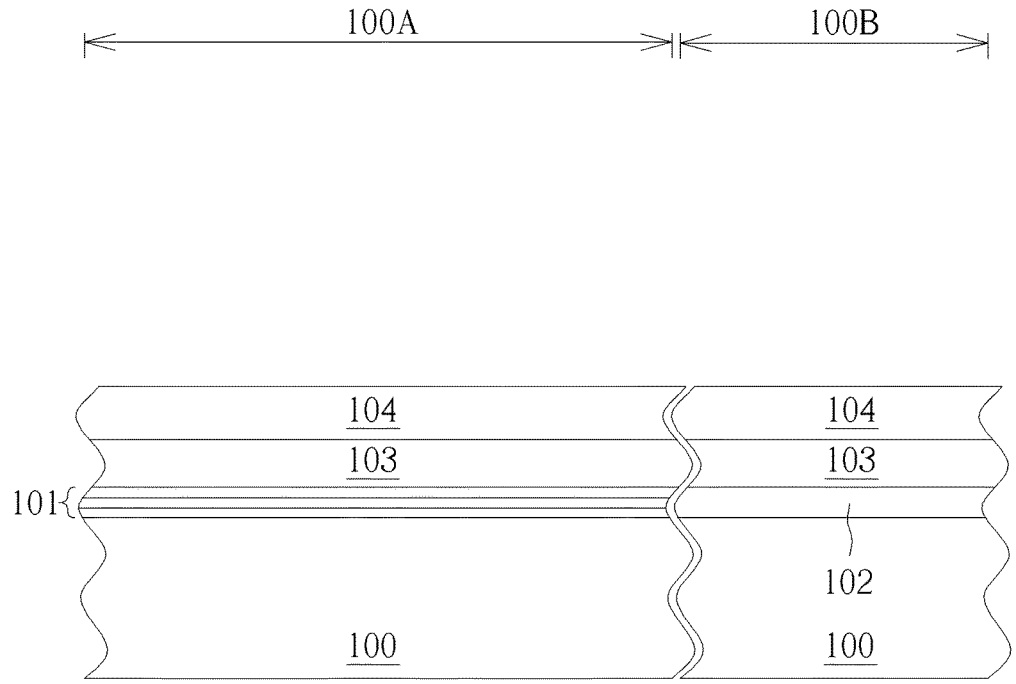

FIGS. 1-8 are cross-sectional views depicting an exemplary process flow of manufacturing a flash memory in accordance with the embodiment of the present invention. Refer to FIG. 1. A memory cell/device is formed preliminarily on a substrate 100. The substrate 100 of the present invention may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate.

The substrate 100 is divided a memory region 100A and a peripheral region 100B. A memory region 100A of the substrate 100 may be used for memory components. For instance, according to the preferred embodiment, the memory region 100A may be used to form a number of select gate/memory gate pairs. High-voltage or low voltage logic circuitry may be formed in the periphery, which includes the peripheral region 100B, according to the preferred embodiments. The memory region 100A and the peripheral region 100B can be isolated from each other by shallow trench isolations (STIs).

Continue to refer to FIG. 1. Gate dielectric layers 101/102 are respectively formed on the memory region 100A and the peripheral region 100B. According to the preferred embodiments, the gate dielectric layers 101/102 on different regions may be different thicknesses to meet different device requirements, but this need not be the case. The gate dielectric layers 101/102 can be any insulating material including (but not limited to) oxides, nitrides, or some combination thereof. Preferably, the gate dielectric layer 101 on the memory region 100A is an oxide/nitride/oxide trilayer stack commonly referred to as "ONO", which serves as a charge trapping dielectric including a charge trapping silicon nitride layer sandwiched between two silicon dioxide layers. Other charge trapping dielectrics may include a silicon-rich nitride film, or any film that includes, but is not limited to, silicon, oxygen, and nitrogen in various stoichiometries. The gate dielectric layer 102 on the peripheral region 100B can be silicon oxide, silicon nitride or other dielectrics.

A gate conductor layer 103 is formed on the gate dielectric layers 101/102. Any appropriate gate conductor material could be used to form the gate conductor layer 103, such as a doped polysilicon, according to the preferred embodiments. The gate conductor layer 103 may be formed or disposed according to any appropriate well-known method such as deposition. Deposition can include any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

A hard mask layer 104 is disposed over the gate conductor layer 103. The hard mask layer 104 may be a silicon nitride layer or a silicon carbon nitride layer. According to a preferred embodiment of the present invention, the hard mask layer 104 is a silicon nitride layer.

Figure 2:
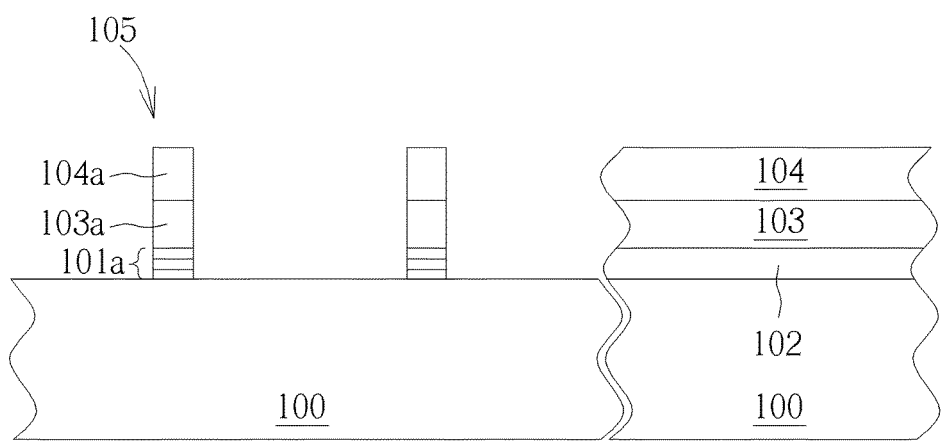

Refer to FIG. 2. It can be noticed that the gate dielectric layer 101, the gate conductor layer 103, and the hard mask layer 104 in the memory region 100A are patterned to create a memory structure 105. This patterning process may include several conventional steps. For example, the hard mask layer 104 may be first patterned into a hard mask 104a using photoresist. An etch process is then performed with the hard mask 104a to pattern the gate conductor layer 103 and the gate dielectric layer 101 into memory gate 103a and gate dielectric 101a.

Figure 3:
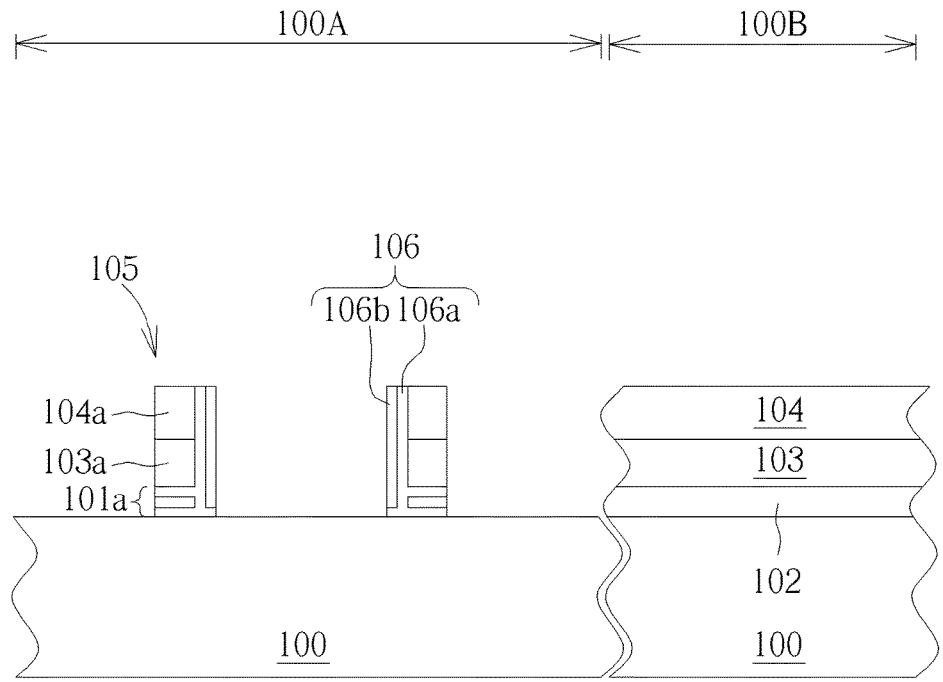

Refer to FIG. 3. A spacer 106 is formed on one side of the memory structure 105. A top surface of the spacer 106 is aligned with a top surface of the hard mask 104a. According to the preferred embodiment, the spacer 106 includes one or more layers of dielectric such as a silicon oxide layer 106a and a silicon nitride layer 106b, which can be referred to as an oxide-nitride (ON) spacer. The formation of spacer 106 may include several conventional steps. For example, a silicon oxide layer 106a and a silicon nitride layer 106b may be formed sequentially and conformally on the memory structure 105 and the substrate 100 by well-known deposition methods. The deposited, conformal silicon oxide layer 106a and silicon nitride layer 106b are then subjected to an etch process. The etch process removes the portion of the silicon oxide layer 106a and the silicon nitride layer 106b on the plane and on one sidewall of the memory gate 105, thus only the portion on the other sidewall of the memory gate 105 will remain to form a spacer structure.

Preferably, the material of the silicon nitride layer 106b is the same as the hard mask 104a. In other words, the silicon nitride layer 106b and the hard mask 104a are both made of silicon nitride. The silicon oxide layer 106a contacts the memory gate 103a.

Figure 4:
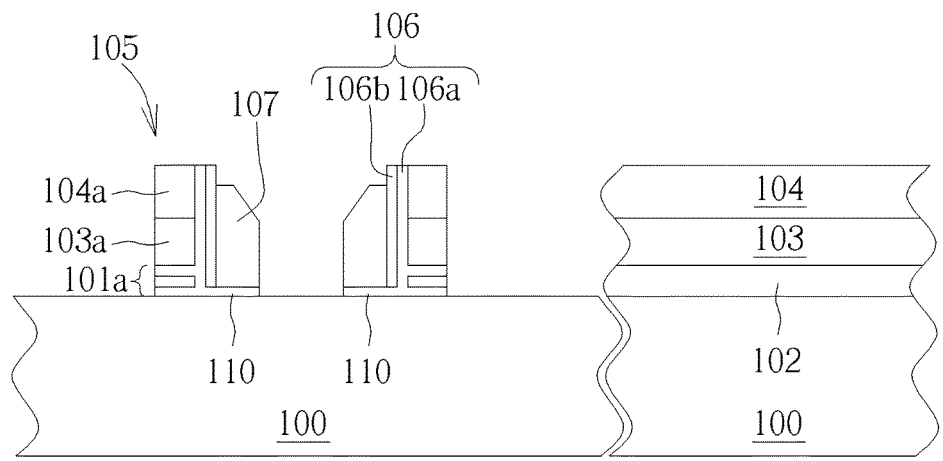

Refer to FIG. 4. A select gate 107 is formed on the side of the spacer 106, wherein the spacer 106 is an interface between the memory structure 105 and the select gate 107. A gate dielectric 110 is formed between the select gate 107 and the substrate 100. The silicon nitride layer 106b contacts the select gate 107. The top surface of the select gate 107 is higher than a top surface of the memory gate 103a, and lower than a top surface of the hard mask 104a. The formation of the select gate 107 may include several conventional steps. For example, a gate dielectric layer and a gate conductor layer are first conformally formed over the memory structure 105 and the substrate 100. The gate conductor layer may be formed of any suitable conductor, such as doped polysilicon. After the formation of the gate conductor layer and the gate dielectric layer, the gate conductor layer may be removed from all portions of the memory structure 105, except for the portion on the sidewall of the spacer 106, according to a number of well-known methods. The select gate 107 formed by the removal of these portions of the gate conductor layer and the gate dielectric layer is depicted in FIG. 4, and is substantially taper-shaped and lower than the hard mask 104a. The above detailed steps of forming the select gate 107 are not depicted in the drawings.

Figure 5:
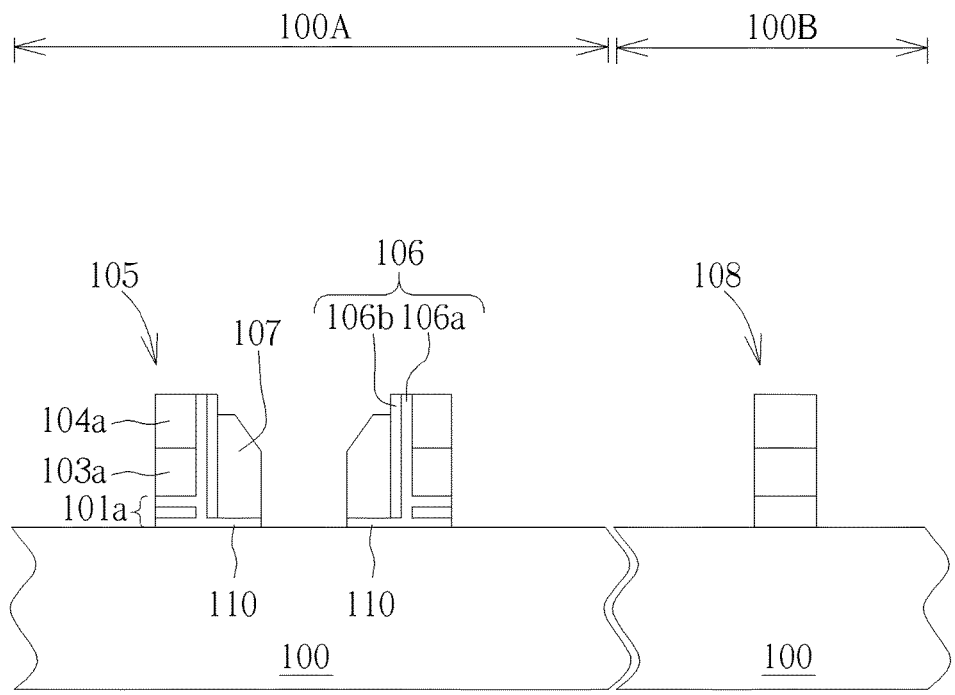

As shown in FIG. 5, a gate structure 108 is defined in the peripheral region 100B. The gate structure 108 may be formed by the same process flow as the memory structure 105 after forming the select gate 107. For example, a photoresist with gate pattern is used to pattern the hard mask layer 104, and a dry etch process is performed by using the patterned hard mask layer 104 to pattern the underlying gate conductor layer 103 and the gate dielectric layer 102. A repeated description of similar steps is omitted for simplicity.

Figure 6:
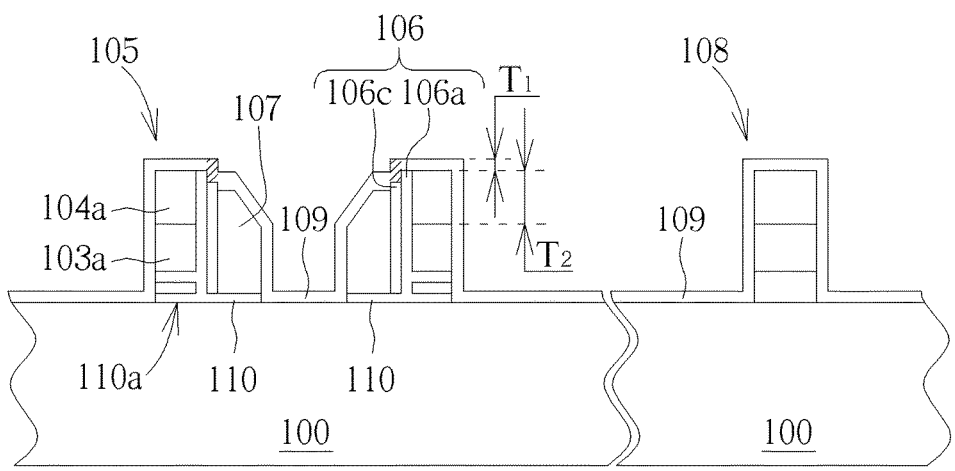

As shown in FIG. 6, a silicon oxide layer 109 is formed to conformally cover the memory structure 105, the spacer 106, the select gate 107 and the substrate 100. A thickness $T_1$ of the silicon oxide layer 109 is greater than 0.35 of a thickness $T_2$ of the hard mask 104a, and smaller than 0.54 of the thickness $T_2$ of the hard mask 104a. The silicon oxide layer 109 is preferably formed by an in situ steam generation (ISSG) process. During the ISSG process, an end of the silicon nitride layer 106b is transformed into the silicon oxide layer 109, and the silicon nitride layer 106b is therefore shortened to become a shorten silicon nitride layer 106c. In detail, the end of the silicon nitride layer 106b is oxidized and becomes part of the silicon oxide layer 109. It is noteworthy that the silicon oxide layer 109 has a thickest part (marked by slashed lines) disposed at an end of the shortened silicon nitride layer 106c. A top surface of the shorten silicon nitride layer 106c is lower than a top surface of the silicon oxide layer 106a. According to a preferred embodiment of the present invention, the thickness $T_2$ of the hard mask 104a is greater than 110 angstroms, and the thickness $T_1$ of the silicon oxide layer 109 is between 40 to 100 angstroms. The thickest part of the silicon oxide layer 109 is preferably between 50 to 60 angstroms.

Figure 7:
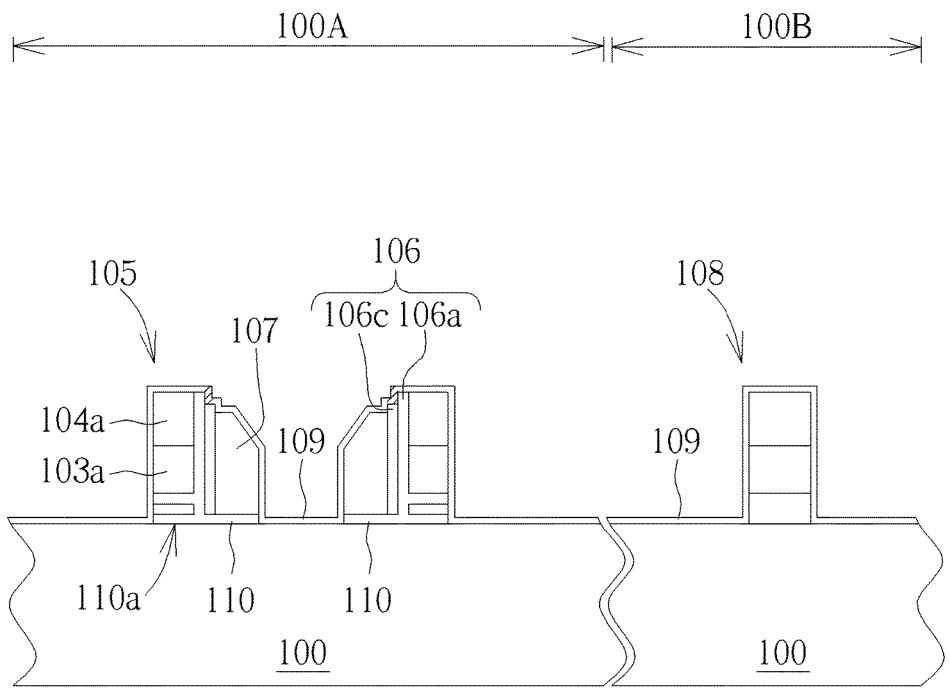

As shown in FIG. 7, the silicon oxide layer 109 is thinned. During the thinning process, the thickness $T_1$ of the entire silicon oxide layer 109 is reduced uniformly, but some of the silicon oxide layer 109 still remains. The thinning process can be performed by a wet etching process, such as using HF as an etchant, for 30 seconds. At this point, the thickest part (marked by slashed lines) of the silicon oxide layer 109 after the thinning process is still at the end of the shortened silicon nitride layer 106c.

Figure 8:
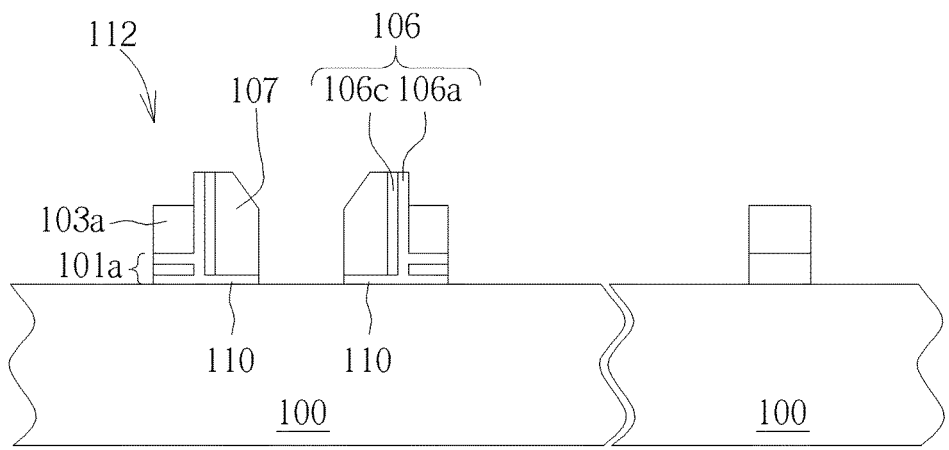

As shown in FIG. 8, after thinning the silicon oxide layer 109, the silicon oxide layer 109 and the hard mask 104a are entirely removed. The silicon oxide layer 109 and the hard mask 104a can be removed by using a wet etching process, such as using $H_3PO_4$ as an etching solution. The $H_3PO_4$ etches the silicon nitride faster than the silicon oxide. The shortened silicon nitride layer 106c and the hard mask 104a are both made of silicon nitride; the shortened silicon nitride layer 106c should be removed entirely during the wet etching process. The end of the shortened silicon nitride layer 106c is covered by the thickest part of the silicon oxide layer 109 during the wet etching process, however, so the thickest part of the silicon oxide layer 109 postpones the wet etching process applied to the shortened silicon nitride layer 106c. Therefore, only some of the shortened silicon nitride layer 106c is removed by the wet etching process. Because $H_3PO_4$ has a lower etching rate to silicon oxide than silicon nitride, and the silicon oxide layer 106a is covered by the silicon oxide layer 109, only some of the silicon oxide layer 106a is removed by the wet etching process while the entire hard mask 104a made of silicon nitride is removed. As a result, the integrity of the remaining shortened silicon nitride layer 106c and the silicon oxide layer 106a is sufficient to isolate the select gate 107 and the memory gate 103a. Furthermore, after removing the hard mask 104a, the top surface of the shortened silicon nitride layer 106c and the silicon oxide layer 106a are both aligned with the top surface of the select gate 107. At this point, a flash memory 112 of the present invention is completed. The flash memory 112 includes the select gate 107, the memory gate 103a, the spacer 106, the gate dielectric 101a and the gate dielectric 110.

Before removing the hard mask 104a, the silicon oxide layer 109 is formed to cover the spacer 106, the hard mask 104a and the select gate 107. The thickest part of the silicon oxide layer 109 serves as a sacrifice layer for the shortened silicon nitride layer 106c, wherein the thickest part blocks the wet etching solution from etching the shortened silicon nitride layer 106c at the beginning of the etching processes, and therefore reduces the etching time applied to the shorten silicon nitride layer 106c. In the end, enough of the shorten silicon nitride layer 106c will be left between the memory gate 103a and the select gate 107 after removing the hard mask 104a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a flash memory, comprising the steps of:
   providing a substrate, a memory gate on the substrate, a hard mask on the memory gate, a spacer on a sidewall of the memory gate, and a select gate disposed on a sidewall of the spacer;
   forming a first silicon oxide layer directly contacting the memory gate, the hard mask, the spacer, and the select gate, wherein a thickness of the first silicon oxide layer is greater than 0.35 of a thickness of the hard mask; and
   entirely removing the first silicon oxide layer and the hard mask within one process;
   wherein the spacer consists of a second silicon oxide layer and a silicon nitride layer;
   wherein during forming the first silicon oxide layer, an end of the silicon nitride layer is transformed into the first silicon oxide layer, and the silicon nitride layer is shortened to become a shortened silicon nitride layer;
   further comprising thinning the first silicon oxide layer; and
   wherein the first silicon oxide layer and the hard mask are entirely removed after thinning the first silicon oxide layer.

2. The method of manufacturing a flash memory of claim 1, wherein before forming the first silicon oxide layer, a top surface of the spacer is aligned with a top surface of the hard mask.

3. The method of manufacturing a flash memory of claim 1, wherein a top surface of the select gate is higher than a top surface of the memory gate.

4. The method of manufacturing a flash memory of claim 1, wherein the first silicon oxide layer has a thickest part disposed at an end of the shortened silicon nitride layer.

5. The method of manufacturing a flash memory of claim 1, wherein the thickness of the first silicon oxide layer is greater than 40 angstroms.

6. The method of manufacturing a flash memory of claim 1, wherein the first silicon oxide layer is formed by an in-situ steam generation process.

\* \* \* \* \*